(12) United States Patent
Gui et al.

(10) Patent No.: US 12,375,006 B2
(45) Date of Patent: Jul. 29, 2025

(54) POWER MODULE

(71) Applicant: Delta Electronics, Inc., Taipei (TW)

(72) Inventors: Yingying Gui, Taipei (TW); Yan Zhou, Taipei (TW); Tsai-Sheng Lin, Taipei (TW); Gerardo Jimenez Orozco, Southgate, MI (US); Ze Wang, Taipei (TW); Richard Joseph Hampo, Taipei (TW); Ajay Vasudeo Patwardhan, Taipei (TW); Chung-Shu Lee, Taipei (TW)

(73) Assignee: DELTA ELECTRONICS, INC., Taipei (TW)

( * ) Notice: Subject to any disclaimer, the term of this patent is extended or adjusted under 35 U.S.C. 154(b) by 713 days.

(21) Appl. No.: 17/541,543

(22) Filed: Dec. 3, 2021

(65) Prior Publication Data
US 2023/0178490 A1    Jun. 8, 2023

(51) Int. Cl.
*H02M 1/34*        (2007.01)
*H01L 25/07*       (2006.01)
(Continued)

(52) U.S. Cl.
CPC .......... *H02M 7/003* (2013.01); *H01L 25/072* (2013.01); *H02M 1/08* (2013.01); *H02M 1/34* (2013.01); *H02M 1/348* (2021.05)

(58) Field of Classification Search
CPC ........... H02M 1/34; H02M 1/348; H02M 1/08
See application file for complete search history.

(56) References Cited

U.S. PATENT DOCUMENTS 5,170,337 A    12/1992   Borowiec et al.
7,545,033 B2    6/2009   Grant
(Continued)

FOREIGN PATENT DOCUMENTS

CN    205104489 U    3/2016
CN    112768427 A    5/2021
(Continued)

OTHER PUBLICATIONS

Edgar Ayerbe, "SiC MOSFETs in Optimized Packaging Deliver a 3× Reduction in Switching Losses, Enabling Affordable High-Efficiency EV Battery Chargers," Bodo's Power Systems Magazine, May 30, 2017.

*Primary Examiner* — Gary A Nash
(74) *Attorney, Agent, or Firm* — KIRTON McCONKIE; Evan R. Witt

(57) ABSTRACT

A power module includes first and second electrode terminals adapted to electrically connect to a power source, a first switch element, a second switch element, a first Kelvin source pin, and a second Kelvin source pin. The first switch element is electrically connected to the first electrode terminal. The second switch element is electrically connected between the first switch element and the second electrode terminal and includes a drain and a source electrically connected to the first switch element and the second electrode terminal respectively. The first Kelvin source pin is electrically connected to the source of the second switch element and is adapted to receive a gate drive signal for driving the second switch element. The second Kelvin source pin is electrically connected to the source of the second switch element and is configured to be electrically connected to a snubber circuit.

12 Claims, 12 Drawing Sheets

(51) Int. Cl.
*H02M 1/08* (2006.01)
*H02M 7/00* (2006.01)

(56) References Cited

U.S. PATENT DOCUMENTS

| | | | |
|---|---|---|---|
| 9,589,814 | B2 | 3/2017 | Kim |
| 9,994,110 | B2 | 6/2018 | Xu et al. |
| 10,700,681 | B1 | 6/2020 | Xu et al. |
| 2011/0291236 | A1 | 12/2011 | Hayashi et al. |
| 2013/0248883 | A1 | 9/2013 | Das et al. |
| 2017/0229953 | A1* | 8/2017 | Otake ................ H01L 23/5386 |
| 2019/0253047 | A1* | 8/2019 | Otake .............. H03K 17/04106 |
| 2020/0220534 | A1* | 7/2020 | Koyama .............. H03K 17/567 |

FOREIGN PATENT DOCUMENTS

| | | |
|---|---|---|
| GB | 2564700 A | 1/2019 |
| JP | 2013165578 A | 8/2013 |
| JP | 2018510502 A | 4/2018 |
| JP | 2021005690 A | 1/2021 |
| WO | 2016067835 A1 | 5/2016 |
| WO | 2021015050 A1 | 1/2021 |
| WO | 2021130290 A1 | 7/2021 |

\* cited by examiner

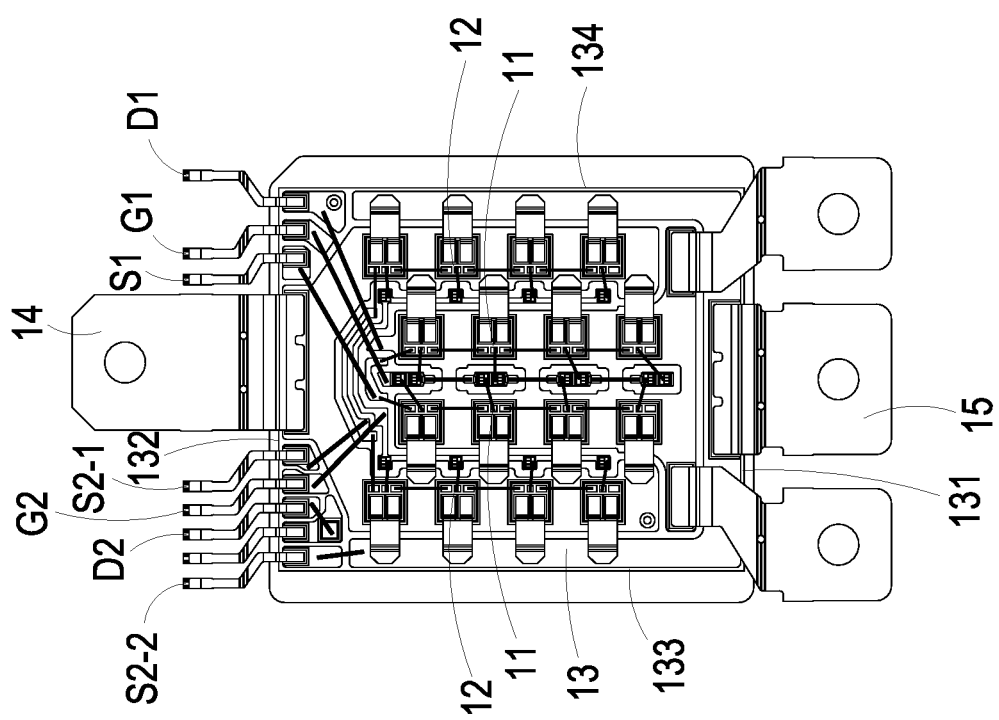

POWER MODULE

FIELD OF THE INVENTION

The present disclosure relates to a power module, and more particularly to a power module capable of decoupling the power loop and the gate drive loop by utilizing Kelvin pins.

BACKGROUND OF THE INVENTION

SiC power module becomes a new hot topic in automotive traction inverter applications. Despite significant improvements in switching loss, the switching ringing as depicted in FIG. 1 may lead to EMC (electromagnetic compatibility) test failures. In FIG. 1, the three waveforms represent low-side MOSFET (metal-oxide-semiconductor field-effect transistor) turn on transient. Vds_H is the diode voltage of the high-side MOSFET, Ids_H is the freewheeling current through the high-side MOSFET, and Vge_terminal is gate signal of the low-side MOSFET being turned on. As shown in FIG. 1, when the low-side MOSFET turns on, switching ringing is observed on high-side diode switching waveform. Conventionally, introducing a snubber circuit to the system is a common practice to suppress voltage spike and ringing.

On the other hand, in order to fulfill the increasing demand for greater output current in inverter application, power module now has many dies connected in parallel. However, most of the power module has no dedicated pins for snubber design. Consequently, the snubber circuit added to the circuit needs to be directly connected to the source and drain signal pins of switch. The snubber and gate drive loops then share part of parasitic in power module. This particular type of connection may couple power loop noise into the gate driver loop and lead to gate oscillation issue. As shown in FIG. 2, due to snubber implementation, noise from snubber circuit causes big voltage spike in gate signal. The low side MOSFET gate oscillation may lead to gate failure and reduce power module reliability.

Therefore, there is a need of providing a power module to obviate the drawbacks encountered from the prior arts.

SUMMARY OF THE INVENTION

It is an objective of the present disclosure to provide a power module capable of decoupling the power loop and the gate drive loop by utilizing Kelvin pins. In particular, the power module includes two Kelvin pins dedicated for gate drive purpose and snubber design respectively. Therefore, the power loop ringing is prevented from polluting the gate drive signal. Consequently, the power loop ringing is suppressed, the noise on gate drive loop is reduced, and the reliability of the power module is enhanced.

In accordance with an aspect of the present disclosure, there is provided a power module including a first electrode terminal, a second electrode terminal, a first switch element, a second switch element, a first Kelvin source pin, and a second Kelvin source pin. The first switch element is electrically connected to the first electrode terminal. The second switch element is electrically connected between the first switch element and the second electrode terminal and includes a drain and a source electrically connected to the first switch element and the second electrode terminal respectively. The first Kelvin source pin is electrically connected to the source of the second switch element and is adapted to receive a gate drive signal for driving the second switch element. The second Kelvin source pin is electrically connected to the source of the second switch element and is configured to be electrically connected to a snubber circuit.

BRIEF DESCRIPTION OF THE DRAWINGS

FIG. 5B is a top view of the packaging implementation of the power module of FIG. 5;

DETAILED DESCRIPTION OF THE PREFERRED EMBODIMENT

Figure 1:
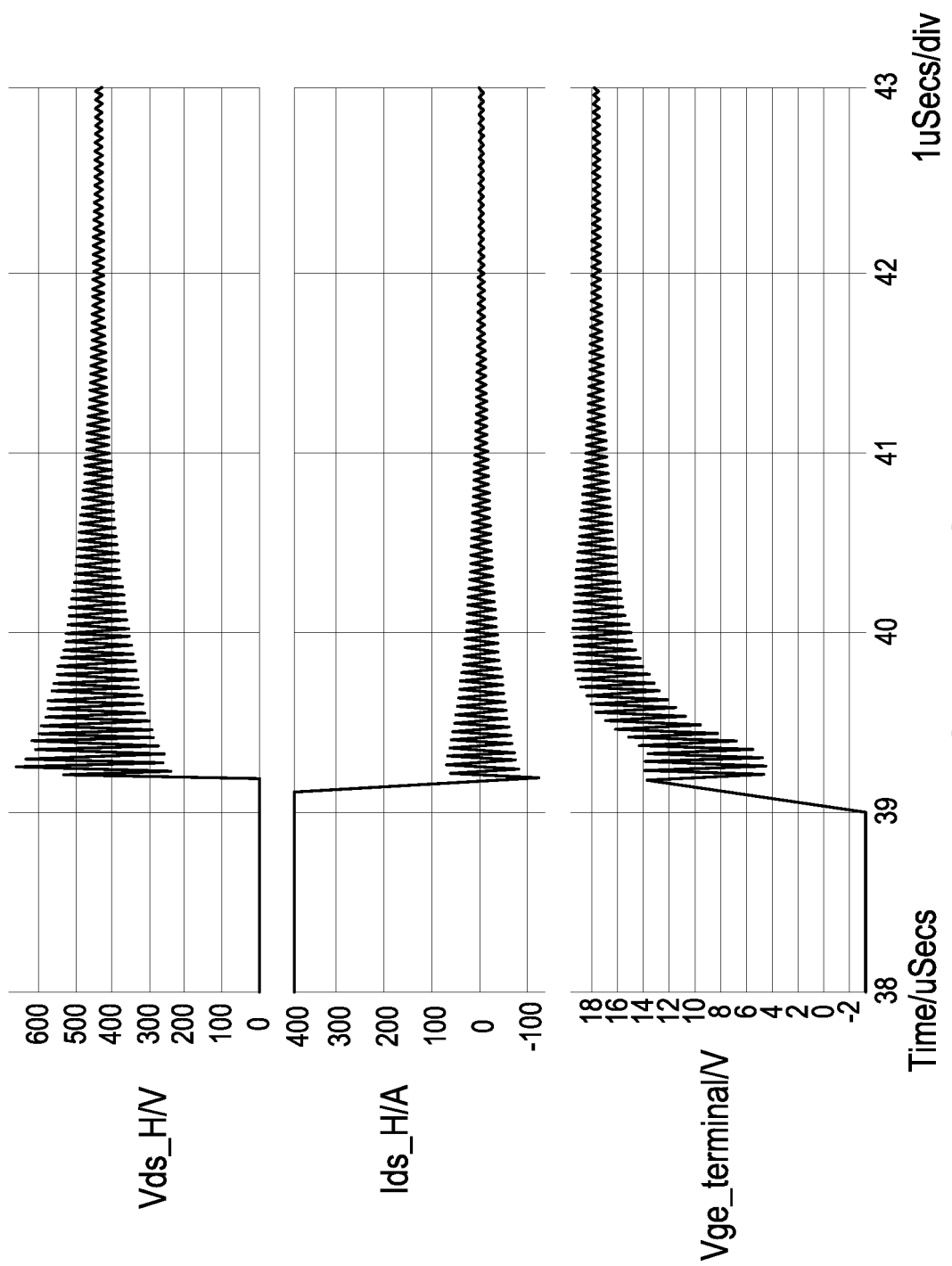
FIGS. 1 and 2 are schematic oscillograms showing waveforms of the diode voltage and current of the high-side MOSFET and the gate signal of the low-side MOSFET during turn on transient of the low-side MOSFET.
Figure 2:
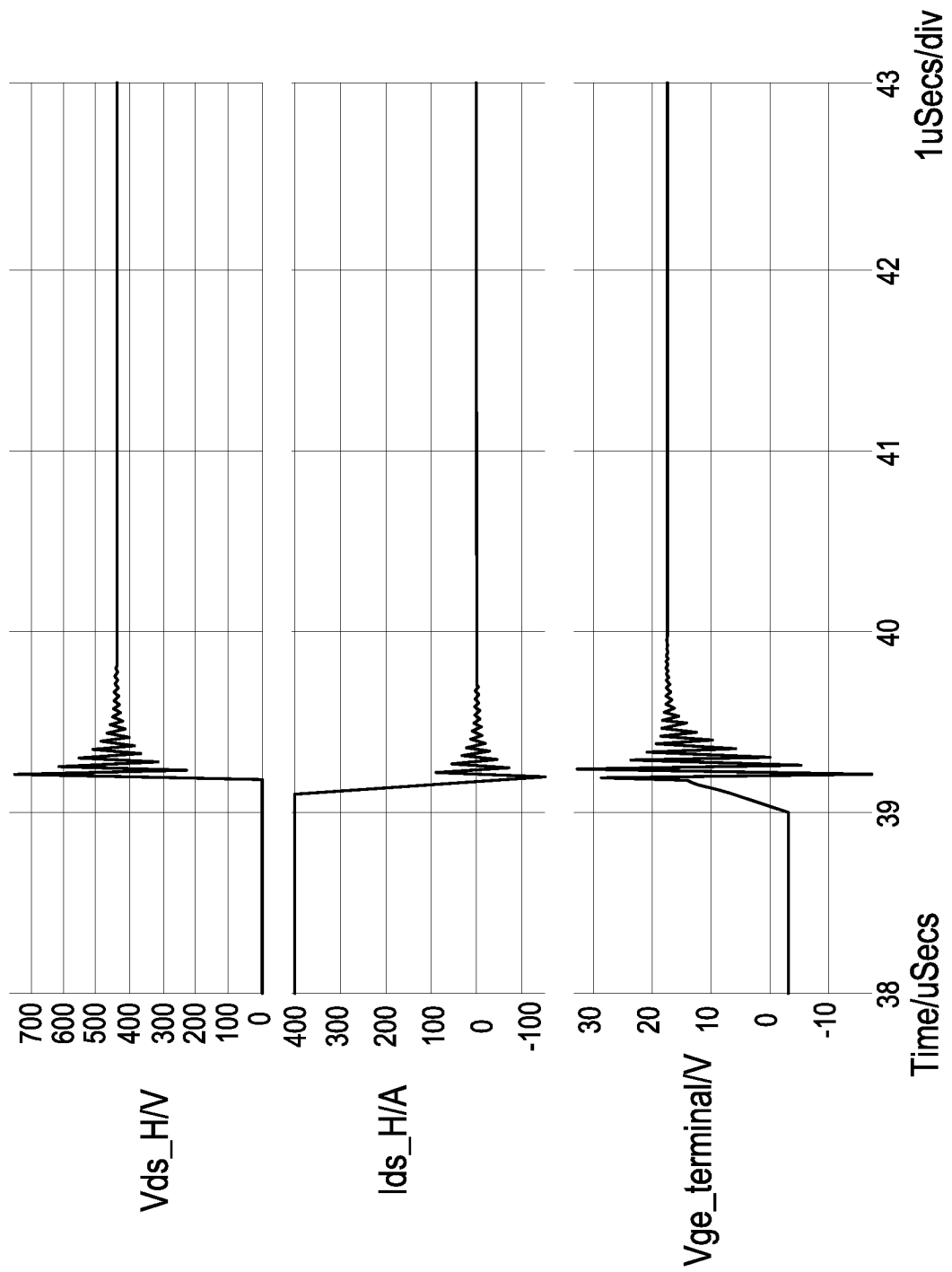

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. While the numerical ranges and parameters set forth for the broad scope of the present invention are approximations, the numerical value reported in the specific examples set forth as accurately as possible. However, any numerical values inherently contain certain errors necessarily the standard deviation found in the respective testing measurements caused. Also, as used herein, the term "about" generally means away from a given value or a range of 10%, 5%, 1% or 0.5%. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 3:
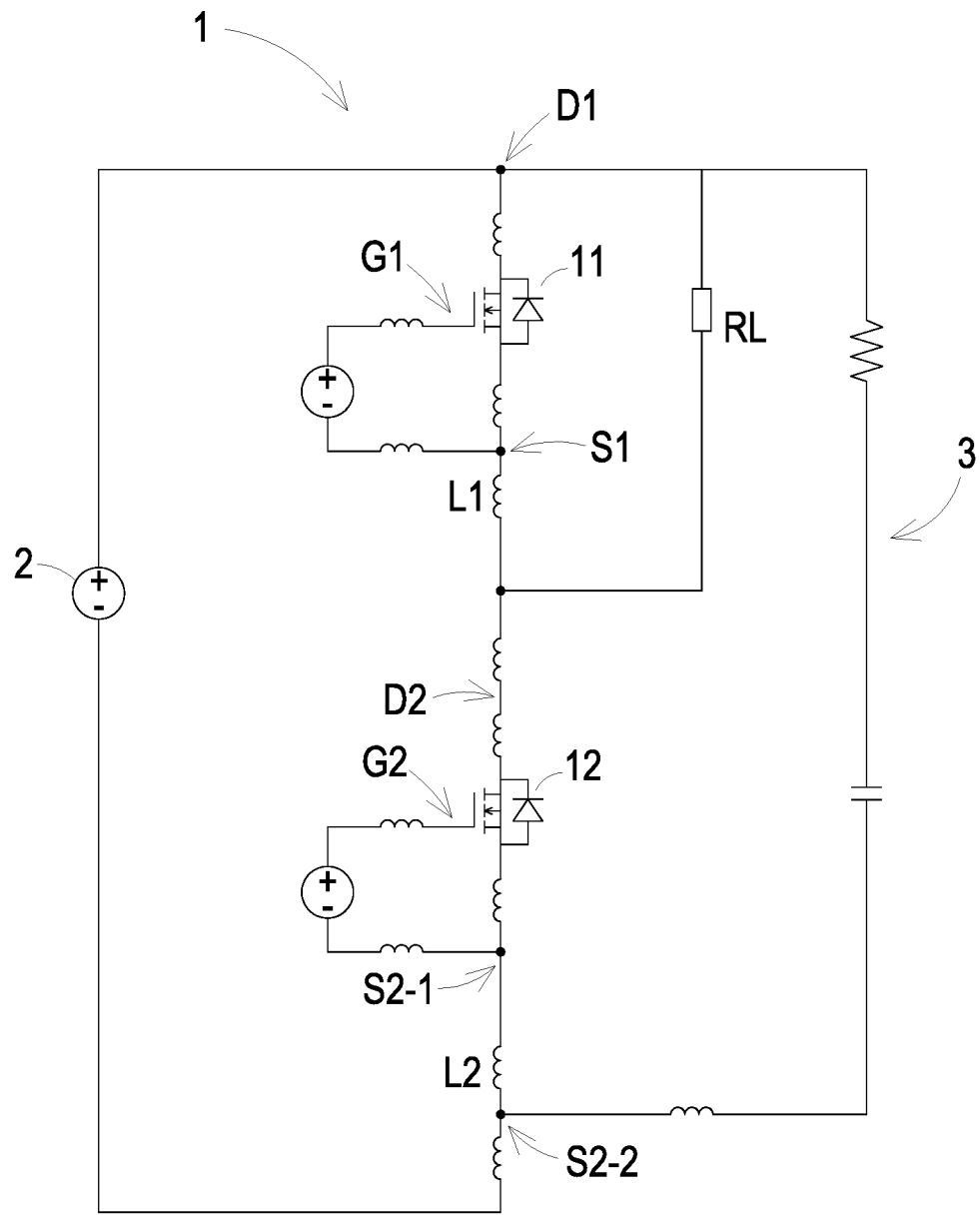
FIG. 3 is a schematic circuit diagram illustrating a power module according to a first embodiment of the present disclosure.

FIG. 3 is a schematic circuit diagram illustrating a power module according to a first embodiment of the present disclosure. As shown in FIG. 3, the power module 1 includes a first electrode terminal, a second electrode terminal, a first switch element 11, a second switch element 12, a first Kelvin source pin S2-1, and a second Kelvin source pin S2-2. The first and second electrode terminals are adapted to electrically connect to a power source 2, wherein the first and second electrode terminals of the power module 1 are configured to electrically connect to different terminals of the power source 2 respectively. In the embodiment, the first and second electrode terminals of the power module 1 are electrically connected to a positive terminal and a negative terminal of the power source 2 respectively. The first switch element 11 is electrically connected between the first electrode terminal and the second switch element 12. The second switch element 12 is electrically connected between the first switch element 11 and the second electrode terminal and includes a source, a gate, and a drain, and the drain and the source of the second switch element 12 are electrically connected to the first switch element 11 and the second electrode terminal respectively. The first Kelvin source pin S2-1 is electrically connected to the source of the second switch element 12 and is adapted to receive a gate drive signal configured for driving the second switch element 12. The second Kelvin source pin S2-2 is electrically connected to the source of the second switch element 12 and is configured to be electrically connected to a snubber circuit 3. As an example, the snubber circuit 3 includes an inductor, a capacitor, and a resistor serially connected between the positive terminal of the power source 2 and the second Kelvin source pin S2-2, but not limited thereto. In one embodiment, the snubber circuit 3 is adapted to absorb power loop ringing. In one embodiment, RL is an inductor load, and all the inductors are parasitic inductors. In an embodiment, the parasitic inductor may be replaced by a real inductor.

It is noted that the first and second Kelvin source pins S2-1 and S2-2 of the power module 1 are dedicated for gate drive purpose and snubber design respectively. Therefore, the gate drive signal transmitted through the first Kelvin source pin S2-1 and the power transmitted through the second Kelvin source pin S2-2 may be decoupled with each other in some embodiments. In the embodiment, the gate drive signal transmitted through the first Kelvin source pin S2-1 and the power transmitted through the second Kelvin source pin S2-2 are decoupled with each other, thereby preventing the power loop ringing from polluting the gate drive signal. Consequently, the power loop ringing is suppressed by the snubber circuit, the noise on gate drive loop is reduced due to the decoupling realized by the first and second Kelvin source pins S2-1 and S2-2, and thus the reliability of the power module 1 is enhanced.

For increasing the output current, the power module 1 may include many switch elements connected in parallel, and the actual number of switch elements is determined according to actual requirements. In some embodiments, the first switch element 11 and the second switch element 12 may be power semiconductor devices which may include but not limited to a diode or a field-effect transistor, such as MOSFET or IGBT (insulated gate bipolar transistor). In one embodiment, the first switch element 11 may include a diode or a field-effect transistor, such as MOSFET or IGBT (insulated gate bipolar transistor), and the second switch element 12 may include a field-effect transistor like MOSFET or IGBT. Two packaging implementations of the power module 1 are exemplified as follows.

Figure 4A:
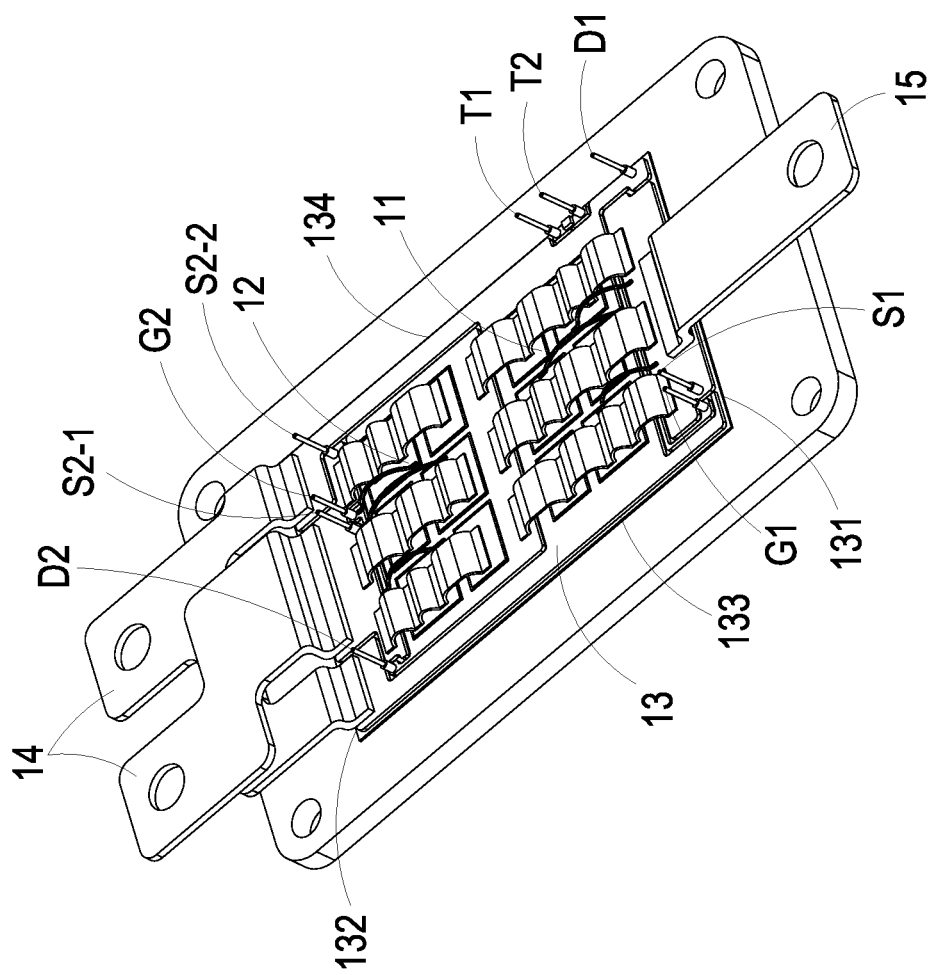
FIG. 4A is a schematic perspective view illustrating a packaging implementation of the power module according to the first embodiment of the present disclosure.
Figure 4B:
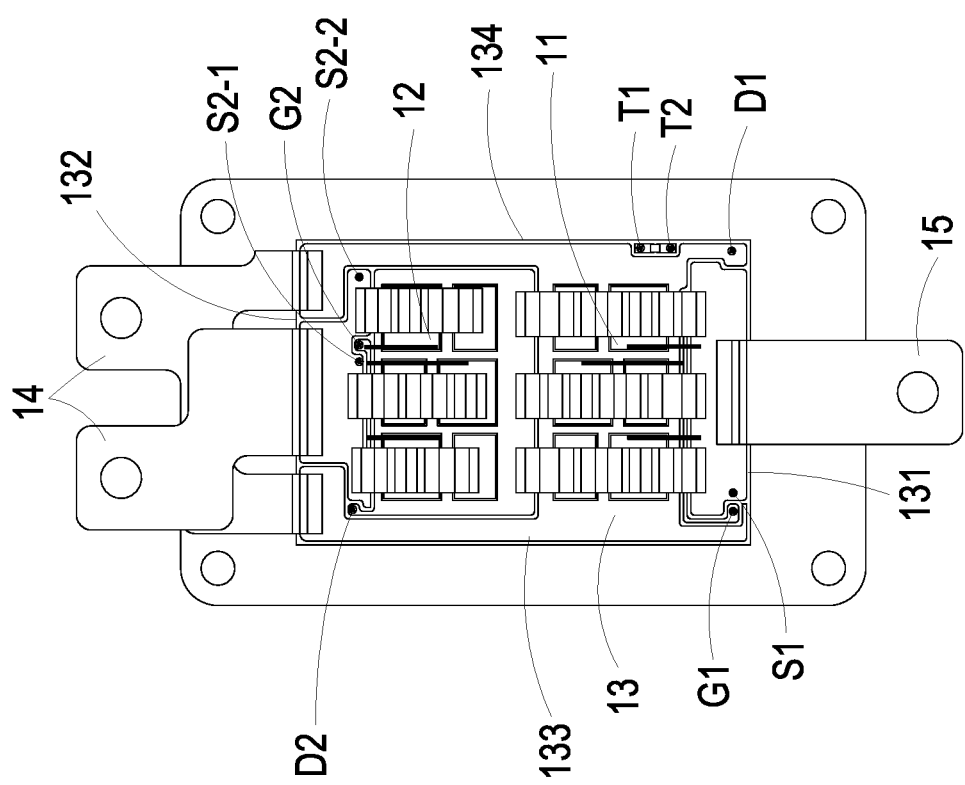
FIG. 4B is a top view of the packaging implementation of the power module of FIG. 4A.

FIG. 4A is a schematic perspective view illustrating a packaging implementation of the power module according to the first embodiment of the present disclosure, and FIG. 4B is a top view of the packaging implementation of the power module of FIG. 4A. In the packaging implementation of FIG. 4A and FIG. 4B, the first and second switch elements 11 and 12 are IGBTs. As shown in FIG. 4A and FIG. 4B, the power module 1 includes a plurality of first switch elements 11 connected in parallel and a plurality of second switch elements 12 connected in parallel. Moreover, the power module 1 further includes a circuit board 13, a first source pin S1, a first gate pin G1, a first drain pin D1, a second gate pin G2, and a second drain pin D2. All of the first and second switch elements 11 and 12, the first source pin S1, the first gate pin G1, the first drain pin D1, the first and second Kelvin pins S2-1 and S2-2, the second gate pin G2, and the second drain pin D2 are all disposed on the circuit board 13. The first source pin S1, the first gate pin G1, and the first drain pin D1 are electrically connected to sources, gates, and drains of the plurality of first switch elements 11 respectively. The first and second Kelvin source pins S2-1 and S2-2 are electrically connected to sources of the plurality of second switch elements 12 respectively. The second gate pin G2 and the second drain pin D2 are electrically connected to gates and drains of the plurality of second switch elements 12 respectively. The relations of electrical connection among the pins and switch elements are shown in FIG. 3 as well. Each pin is electrically connected to corresponding source, gate or drain of switch element through bonding wire, clip or conductive pattern on the circuit board 13. It is noted that the first Kelvin source pin S2-1 and the second Kelvin source pin S2-2 are electrically connected to the source of second switch elements 12 through different wire, clip or conductive pattern, so as to avoid interference and realize decoupling. Further, since the first and second Kelvin source pins S2-1 and S2-2 are laid out separately, the gate drive loop doesn't share the same source inductance (i.e., the inductance L2 shown in FIG. 3) with the snubber loop.

The circuit board 13 is rectangular and has a first side 131, a second side 132, a third side 133, and a fourth side 134. The first side 131 is opposite to the second side 132, and the third side 133 is opposite to the fourth side 134. The first source pin S1, the first gate pin G1, the first drain pin D1, and the plurality of first switch elements 11 are disposed neighboring to the first side 131. The first and second Kelvin source pins S2-1 and S2-2, the second gate pin G2, the second drain pin D2, and the plurality of second switch elements 12 are disposed neighboring to the second side 132. In addition, the power module 1 includes the electrode terminals 14 and 15 adapted to be electrically connected to a power source for receiving power and outputting power. In an embodiment, the power module 1 further includes pins T1 and T2 configured to be connected to thermistor.

Figure 5A:
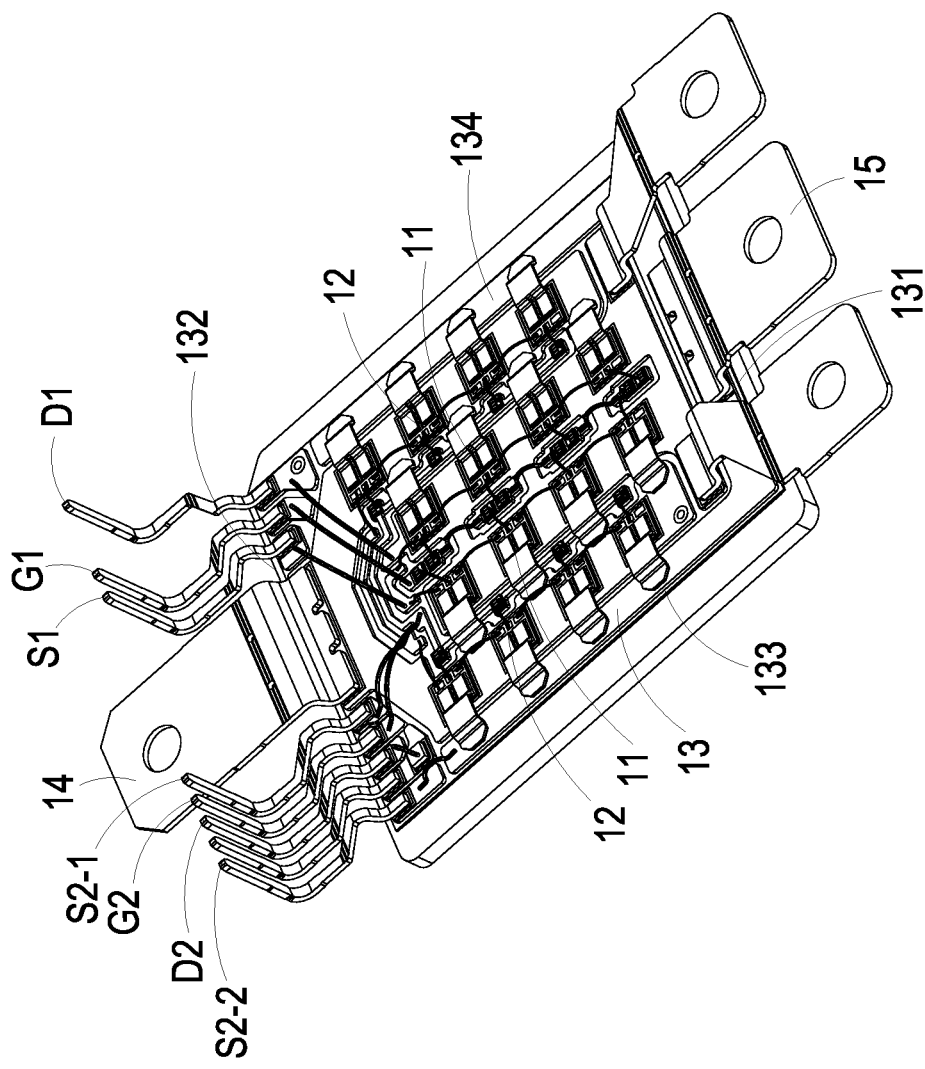
FIG. 5A is a schematic perspective view illustrating another packaging implementation of the power module according to the first embodiment of the present disclosure.

FIG. 5A is a schematic perspective view illustrating another packaging implementation of the power module according to the first embodiment of the present disclosure, and FIG. 5B is a top view of the packaging implementation of the power module of FIG. 5A. In the packaging implementation of FIG. 5A and FIG. 5B, the first and second switch elements 11 and 12 are MOSFETs. In FIG. 5A and FIG. 5B, the component parts and elements corresponding to those of FIG. 4A and FIG. 4B are designated by identical numeral references, and detailed descriptions thereof are omitted herein. Compared with FIG. 4A and FIG. 4B, the disposed positions of pins and switch elements in FIG. 5A and FIG. 5B are different. In particular, as shown in FIG. 5A and FIG. 5B, all the pins of the power module 1 are disposed neighboring to the second side 132, the plurality of first switch elements 11 are disposed along a central line between the third side 133 and the fourth side 134, and the plurality of second switch elements 12 are disposed between the plurality of first switch elements 11 and the third and fourth sides 133 and 134. Namely, the plurality of the second switch elements 12 are disposed on the region between the first switch elements 11 and the third side 133 and the region between the first switch elements 11 and the fourth side 134. In an embodiment, in all the pins electrically connected to the second switch elements 12, the distance between the first and second Kelvin source pins S2-1 and S2-2 is the longest.

In addition, the first switch element 11 shown in FIGS. 4A to 5B is implemented by IGBT or MOSFET, but not limited thereto. The first switch element 11 may be implemented by other types of transistors, such as junction gate field-effect transistor or bipolar junction transistor. In some embodiments, the first switch element 11 may be implemented by diode.

Figure 6:
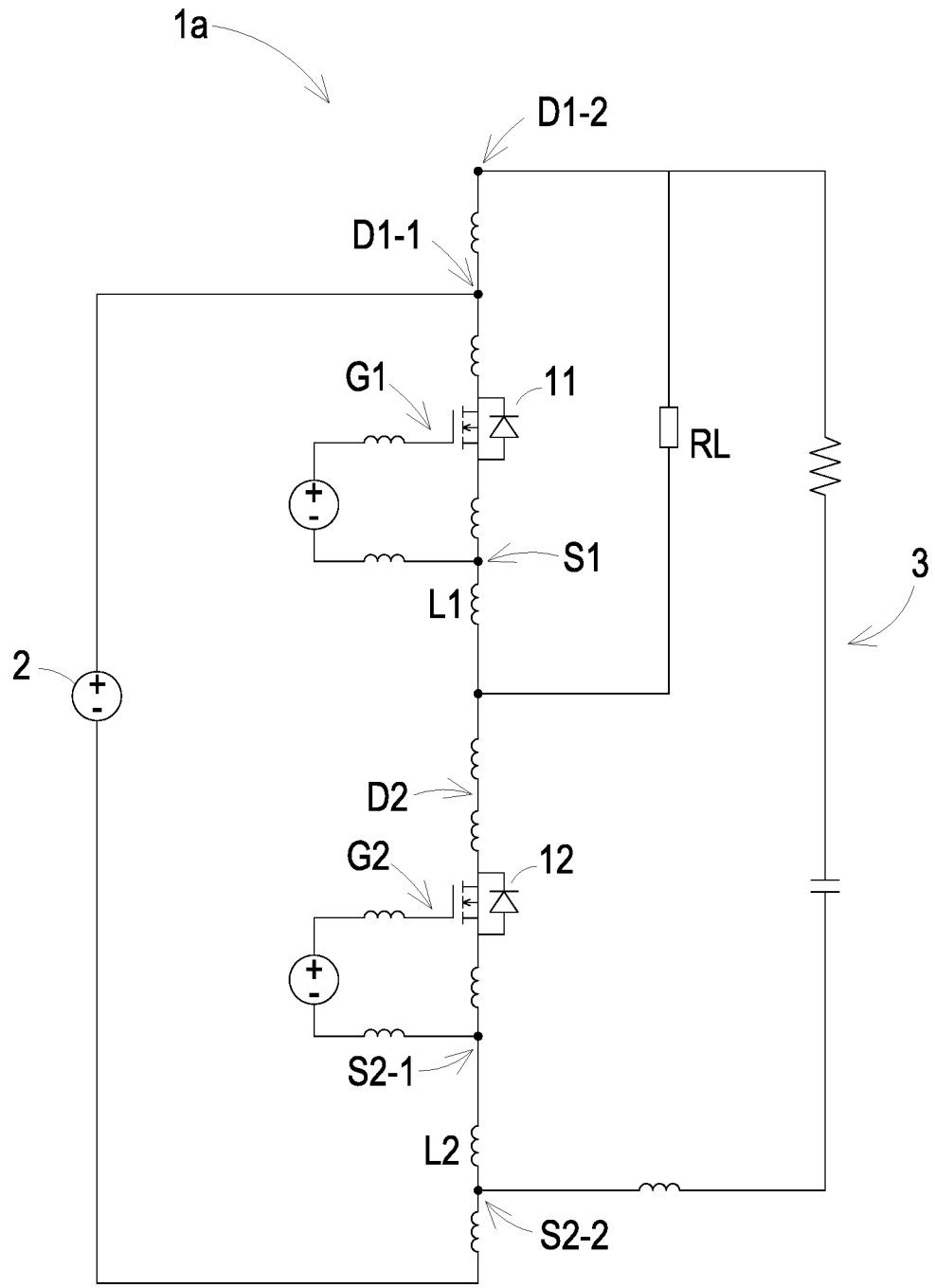
FIG. 6 is a schematic circuit diagram illustrating a power module according to a second embodiment of the present disclosure.

FIG. 6 is a schematic circuit diagram illustrating a power module according to a second embodiment of the present disclosure, the component parts and elements corresponding to those of FIG. 3 are designated by identical numeral references, and detailed descriptions thereof are omitted herein. In the second embodiment, the first and second switch elements 11 and 12 are both field-effect transistors. As shown in FIG. 6, the power module 1a according to the second embodiment further includes a first Kelvin collector pin D1-1 and a second Kelvin collector pin D1-2. The drain and source of the first switch element 11 are electrically connected to the power source 2 and the drain of the second switch element 12 respectively. The first and second Kelvin collector pins D1-1 and D1-2 are electrically connected to the drain of the first switch element 11 respectively. The first Kelvin collector pin D1-1 is configured to be electrically connected to a detection circuit (not shown) for desaturation protection. In specific, the detection circuit is adapted to protect the first switch element 11 from short circuit fault. With the first Kelvin collector pin D1-1, the power loop is separated from the desaturation sensing path, and thus the switching ringing on the first switch element 11 is prevented from affecting the desaturation sensitivity during transient. The second Kelvin collector pin D1-2 is configured to be electrically connected to the snubber circuit 3. The detecting signal transmitted through the first Kelvin collector pin D1-1 for desaturation sensing and the power transmitted through the second Kelvin collector pin D1-2 are decoupled with each other.

Similar to the power module 1 of the first embodiment, the power module 1a may include many switch elements connected in parallel for increasing the output current, and the actual number of switch elements is determined according to actual requirements. Two packaging implementations of the power module 1a are exemplified as follows.

Figure 7A:
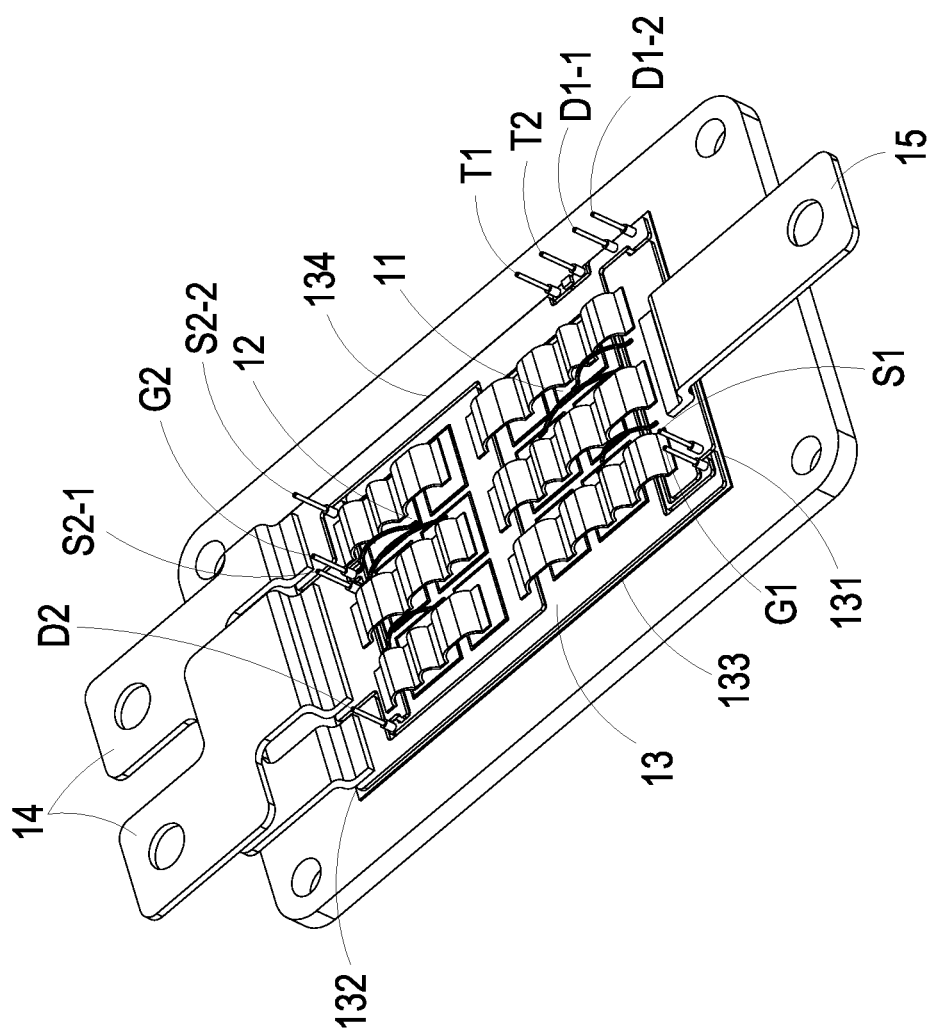
FIG. 7A is a schematic perspective view illustrating a packaging implementation of the power module according to the second embodiment of the present disclosure.
Figure 7B:
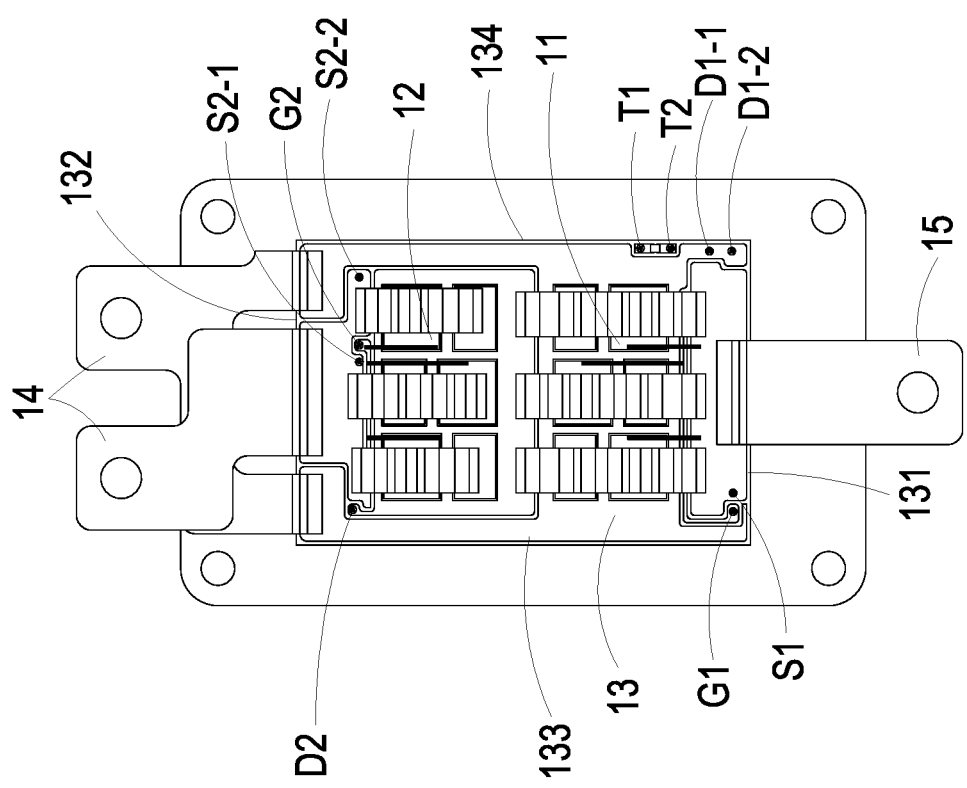
FIG. 7B is a top view of the packaging implementation of the power module of FIG. 7A.

FIG. 7A is a schematic perspective view illustrating a packaging implementation of the power module according to the second embodiment of the present disclosure, FIG. 7B is a top view of the packaging implementation of the power module of FIG. 7A. In FIG. 7A and FIG. 7B, the component parts and elements corresponding to those of FIG. 4A and FIG. 4B are designated by identical numeral references, and detailed descriptions thereof are omitted herein. Further, in FIG. 7A and FIG. 7B, the first and second switch elements 11 and 12 are IGBTs. As shown in FIG. 7A and FIG. 7B, the first and second Kelvin collector pins D1-1 and D1-2 are disposed on the circuit board 13 and are neighboring to the first side 131. The first and second Kelvin collector pins D1-1 and D1-2 are electrically connected to drains of the plurality of first switch elements 11 respectively through bonding wire or conductive pattern on the circuit board 13.

Figure 8A:
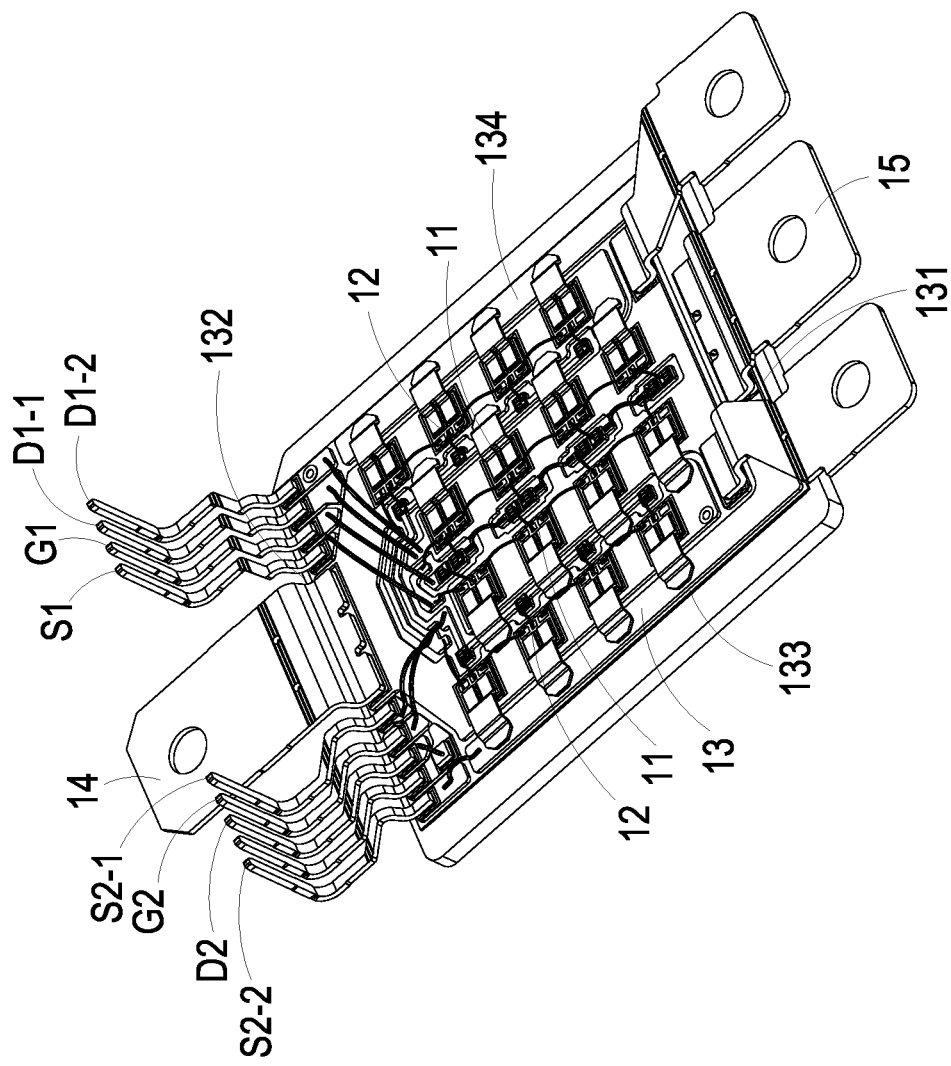
FIG. 8A is a schematic perspective view illustrating another packaging implementation of the power module according to the second embodiment of the present disclosure.
Figure 8B:
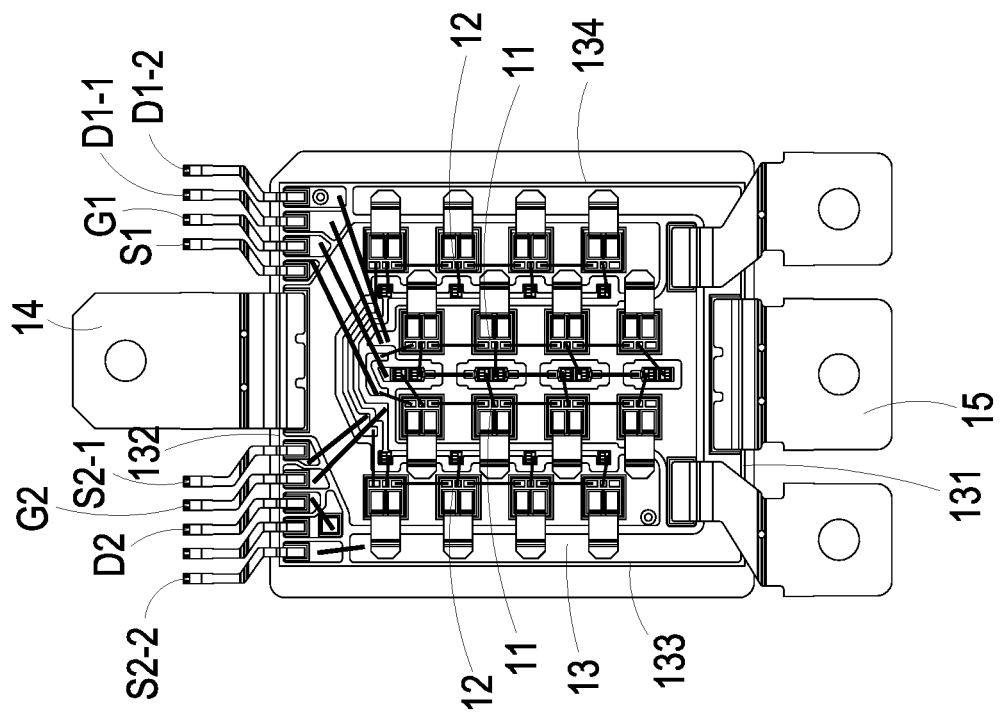
FIG. 8B is a top view of the packaging implementation of the power module of FIG. 8A.

FIG. 8A is a schematic perspective view illustrating another packaging implementation of the power module according to the second embodiment of the present disclosure, FIG. 8B is a top view of the packaging implementation of the power module of FIG. 8A. In FIG. 8A and FIG. 8B, the component parts and elements corresponding to those of FIG. 5A and FIG. 5B are designated by identical numeral references, and detailed descriptions thereof are omitted herein. Further, in FIG. 8A and FIG. 8B, the first and second switch elements 11 and 12 are MOSFETs. As shown in FIG. 8A and FIG. 8B, the first and second Kelvin collector pins D1-1 and D1-2 are disposed on the circuit board 13 and are neighboring to the second side 132. The first and second Kelvin collector pins D1-1 and D1-2 are electrically connected to drains of the plurality of first switch elements 11 respectively through bonding wire or conductive pattern on the circuit board 13.

From the above descriptions, the present disclosure provides a power module capable of decoupling the power loop and the gate drive loop by utilizing Kelvin pins. In particular, the power module includes two Kelvin pins dedicated for gate drive purpose and snubber design respectively. Therefore, the power loop ringing is prevented from polluting the gate drive signal. Consequently, the power loop ringing is suppressed, the noise on gate drive loop is reduced, and the reliability of the power module is enhanced.

While the disclosure has been described in terms of what is presently considered to be the most practical and preferred embodiments, it is to be understood that the disclosure needs not be limited to the disclosed embodiment.

What is claimed is:

1. A power module comprising:
    a first electrode terminal and a second electrode terminal adapted to electrically connect to a power source;
    a first switch element electrically connected to the first electrode terminal;
    a second switch element electrically connected between the first switch element and the second electrode terminal and comprising a drain and a source electrically connected to the first switch element and the second electrode terminal respectively;
    a first Kelvin source pin electrically connected to the source of the second switch element and adapted to receive a gate drive signal for driving the second switch element; and
    a second Kelvin source pin electrically connected to the source of the second switch element and configured to be electrically connected to a snubber circuit,
    wherein the first Kelvin source pin and the second Kelvin source pin are connected to the source of the second switch elements by different types of connection.

2. The power module according to claim 1, wherein the gate drive signal transmitted through the first Kelvin source pin and a power transmitted through the second Kelvin source pin are decoupled with each other.

3. The power module according to claim 1, further comprising a circuit board, a first source pin, a first gate pin, a first drain pin, a second gate pin, and a second drain pin, wherein the power module comprises a plurality of said first switch elements and a plurality of said second switch elements, all the switch elements and pins of the power module are disposed on the circuit board, the first source pin, the first gate pin, and the first drain pin are electrically connected to sources, gates, and drains of the plurality of first switch elements respectively, the second gate pin and the second drain pin are electrically connected to gates and drains of the plurality of second switch elements respectively, and the first and second Kelvin source pins are electrically connected to sources of the plurality of second switch elements respectively.

4. The power module according to claim 3, wherein the circuit board has a first side and a second side opposite to the first side, the first source pin, the first gate pin, the first drain pin, and the plurality of first switch elements are disposed neighboring to the first side, and the first Kelvin source pin, the second Kelvin source pin, the second gate pin, and the second drain pin of the plurality of second switch elements are disposed neighboring to the second side.

5. The power module according to claim 3, wherein the circuit board has a first side, a second side, a third side, and a fourth side, the first side is opposite to the second side, the third side is opposite to the fourth side, all the pins of the power module are disposed neighboring to the second side, the plurality of first switch elements are disposed along a central line between the third and fourth sides, and the plurality of second switch elements are disposed between the plurality of first switch elements and the third and fourth sides.

6. The power module according to claim 1, wherein the first switch element comprises a diode, and the second switch element comprises a field-effect transistor.

7. The power module according to claim 1, wherein the first and second switch elements comprise field-effect transistors.

8. The power module according to claim 7, wherein the first switch element comprises a drain and a source electrically connected to the first electrode terminal and the drain of the second switch element respectively, the power module further comprises a first Kelvin collector pin and a second Kelvin collector pin electrically connected to the drain of the first switch element respectively, the first Kelvin collector pin is configured to be electrically connected to a detection circuit for desaturation protection, and the second Kelvin collector pin is configured to be electrically connected to the snubber circuit.

9. The power module according to claim 8, wherein a detecting signal transmitted through the first Kelvin collector pin and a power transmitted through the second Kelvin collector pin are decoupled with each other.

10. The power module according to claim 8, further comprising a circuit board, a first source pin, a first gate pin, a second gate pin, and a second drain pin, wherein the power module comprises a plurality of said first switch elements and a plurality of said second switch elements, the switch elements and pins of the power module are disposed on the circuit board; the first source pin and the first gate pin are electrically connected to sources and gates of the plurality of first switch elements respectively, the first and second Kelvin collector pins are electrically connected to drains of the plurality of first switch elements, the second gate pin and the second drain pin are electrically connected to gates and drains of the plurality of second switch elements respectively, and the first and second Kelvin source pins are electrically connected to sources of the plurality of second switch elements.

11. The power module according to claim 10, wherein the circuit board has a first side and a second side opposite to the first side, the first source pin, the first gate pin, the first and second Kelvin collector pins, and the plurality of first switch elements are disposed neighboring to the first side, and the first and second Kelvin source pins, the second gate pin, and the second drain pin of the plurality of second switch elements are disposed neighboring to the second side.

12. The power module according to claim 10, wherein the circuit board has a first side, a second side, a third side, and a fourth side, the first side is opposite to the second side, the third side is opposite to the fourth side, all the pins of the power module are disposed neighboring to the second side, the plurality of first switch elements are disposed along a central line between the third and fourth sides, and the plurality of second switch elements are disposed between the plurality of first switch elements and the third and fourth sides.

* * * * *